US012677549B2

(12) United States Patent
Li et al.

(10) Patent No.: US 12,677,549 B2
(45) Date of Patent: Jul. 7, 2026

(54) ORGANIC LIGHT-EMITTING DISPLAY PANEL WITH ANTI-CROSSTALK ISOLATING ELECTRODE AND PREPARATION METHOD THEREFOR, AND DISPLAY APPARATUS

(71) Applicant: BOE TECHNOLOGY GROUP CO., LTD., Beijing (CN)

(72) Inventors: Xiaohu Li, Beijing (CN); Lu Wang, Beijing (CN); Zhiqiang Jiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 899 days.

(21) Appl. No.: 17/779,092

(22) PCT Filed: Jun. 11, 2021

(86) PCT No.: PCT/CN2021/099740
§ 371 (c)(1),
(2) Date: May 23, 2022

(87) PCT Pub. No.: WO2021/259082
PCT Pub. Date: Dec. 30, 2021

(65) Prior Publication Data
US 2022/0393131 A1 Dec. 8, 2022

(30) Foreign Application Priority Data

Jun. 22, 2020 (CN) .......................... 202010572769.6
Jun. 4, 2021 (CN) .......................... 202110625799.3

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *H10K 50/15* (2023.02);
(Continued)

(58) Field of Classification Search
CPC ...... H10K 50/805; H10K 50/15; H10K 50/16; H10K 50/171; H10K 59/1213;
(Continued)

(56) References Cited

U.S. PATENT DOCUMENTS 7,455,564 B2 * 11/2008 Matsumoto ............ H10K 71/00
445/24
2006/0113899 A1 6/2006 Matsumoto et al.
(Continued)

FOREIGN PATENT DOCUMENTS

CN 1822727 A 8/2006
CN 101308865 A 11/2008
(Continued)

OTHER PUBLICATIONS

Jian; Shou-fu, CN-109491121-A, Machine Translation (Year: 2019).*
(Continued)

*Primary Examiner* — Jacob Y Choi
*Assistant Examiner* — Grace Cha
(74) *Attorney, Agent, or Firm* — BROOKS KUSHMAN P.C.

(57) ABSTRACT

An organic light-emitting display panel and a preparation method therefor, and a display apparatus. The organic light-emitting display panel comprises: a substrate; a plurality of organic light-emitting diodes, wherein the plurality of organic light-emitting diodes are located on the substrate, and each of the organic light-emitting diodes is provided with a first electrode, a second electrode, and a light-emitting layer and a hole injection layer which are located between the first electrode and the second electrode; and
(Continued)

anti-crosstalk isolation electrodes, wherein each of the anti-crosstalk isolation electrodes is located at a gap between two adjacent organic light-emitting diodes, the anti-crosstalk isolation electrodes are configured to connect to a fixed voltage, and a voltage difference between each anti-crosstalk isolation electrode and each second electrode is less than a voltage difference between each first electrode and each second electrode.

17 Claims, 3 Drawing Sheets

(51) Int. Cl.

| | |
|---|---|
| *H10K 50/15* | (2023.01) |
| *H10K 50/16* | (2023.01) |
| *H10K 50/17* | (2023.01) |
| *H10K 59/121* | (2023.01) |
| *H10K 59/122* | (2023.01) |
| *H10K 59/80* | (2023.01) |

(52) U.S. Cl.
CPC .......... *H10K 50/16* (2023.02); *H10K 50/171* (2023.02); *H10K 59/1213* (2023.02); *H10K 59/122* (2023.02); *H10K 59/805* (2023.02); *G09G 2300/0426* (2013.01); *G09G 2320/0209* (2013.01)

(58) Field of Classification Search
CPC .... H10K 59/122; H10K 71/00; H10K 59/805; H10K 50/13; H10K 59/131
See application file for complete search history.

(56) References Cited

U.S. PATENT DOCUMENTS

| | | | | |
|---|---|---|---|---|
| 2008/0284323 | A1* | 11/2008 | Kashiwabara ... | H10K 59/80522 |
| | | | | 313/504 |
| 2010/0302221 | A1 | 12/2010 | Okumoto | |
| 2016/0118449 | A1* | 4/2016 | Sato ..................... | H10K 50/805 |
| | | | | 257/89 |
| 2017/0309860 | A1* | 10/2017 | Omata ................. | H10K 50/171 |

FOREIGN PATENT DOCUMENTS

| | | | | | |
|---|---|---|---|---|---|
| CN | 101911832 | A | | 12/2010 | |
| CN | 102623485 | A | | 8/2012 | |
| CN | 109491121 | A | * | 3/2019 | ......... G02F 1/13338 |
| CN | 111668276 | A | | 9/2020 | |

OTHER PUBLICATIONS

International Search Report and Written Opinion for Application No. PCT/CN2021/099740, dated Sep. 13, 2021, 10 Pages.
First Chinese Office Action for Chinese Application No. 202110625799.3 mailed May 28, 2025. 25 pages.

* cited by examiner

| 220 |
|---|
| 280 |
| 270B |
| 230C |
| 230B |
| 250B |
| 240B |
| 70 |
| 270A |
| 230A |
| 250A |
| 240A |

210

ORGANIC LIGHT-EMITTING DISPLAY PANEL WITH ANTI-CROSSTALK ISOLATING ELECTRODE AND PREPARATION METHOD THEREFOR, AND DISPLAY APPARATUS

CROSS REFERENCE TO RELATED APPLICATIONS

This application is the U.S. national phase of PCT Application No. PCT/CN2021/099740 filed on Jun. 11, 2021, which claims priority to Chinese Patent Application No. 202010572769.6 filed on Jun. 22, 2020, and to Chinese Patent Application No. 202110625799.3, filed on Jun. 4, 2021, which are incorporated herein by reference in their entireties.

TECHNICAL FIELD

This application relates to the field of display, and in particular to, an organic light-emitting display panel and a method of manufacturing the same, and a display apparatus.

BACKGROUND

Silicon-based OLED products are widely used in AR/VR, camera viewfinder or sighting telescope due to its advantage of ultra-high PPI. In order to improve the performance of organic light-emitting diodes in the OLED products, structures such as a hole transport layer, a hole injection layer and an electron injection layer are added to improve the light-emitting performance of the organic light-emitting diodes. However, the mobility for the film layer in the structures such as the hole injection layer and the like is relatively high in general, and a structure of a common second electrode is used in most of the OLED products, so that the organic light-emitting diode having the film layer with relatively high mobility is liable to a crosstalk occurred at an interval between two organic light-emitting diodes.

Therefore, the current organic light-emitting display panel, the method of manufacturing the same, and the display apparatus including the same need to be improved.

SUMMARY

In one aspect of the present application, an organic light-emitting display panel is provided. The organic light-emitting display panel comprises: a substrate; a plurality of organic light-emitting diodes, where the plurality of the organic light-emitting diodes is located on the substrate, and each of the plurality of the organic light-emitting diodes has a first electrode, a second electrode, a light-emitting layer and a hole injection layer, the light-emitting layer and the hole injection layer are located between the first electrode and the second electrode; an anti-crosstalk isolating electrode, where the anti-crosstalk isolating electrode is located at an interval between two adjacent the organic light-emitting diodes, and is configured to be connected to a fixed voltage, and a voltage difference between the anti-crosstalk isolating electrode and the second electrode is less than a voltage difference between the first electrode and the second electrode. Thus, with the anti-crosstalk isolating electrode, a crosstalk issue caused by a film layer with a higher mobility such as the hole injection layer and the like can be addressed.

In one aspect of the present application, an organic light-emitting display panel is provided. The organic light-emitting display panel comprises: the substrate; a plurality of organic light-emitting diodes, where the plurality of the organic light-emitting diodes is located on the substrate, and each of the plurality of the organic light-emitting diodes has a first electrode, a second electrode, a light-emitting layer and a hole injection layer, the light-emitting layer and the hole injection layer are located between the first electrode and the second electrode; an anti-crosstalk isolating electrode, where the anti-crosstalk isolating electrode is located at an interval between two adjacent the organic light-emitting diodes, and is configured to be connected to a second electrode power supply line. Thus, with the anti-crosstalk isolating electrode, a crosstalk issue caused by a film layer with a higher mobility such as the hole injection layer and the like can be addressed.

According to embodiments of the present application, the organic light-emitting diode is a white organic light-emitting diode. Thus, the performance of the organic light-emitting display panel can be further improved.

According to embodiments of the present application, the organic light-emitting diode comprises: the first electrode; the hole injection layer, where the hole injection layer is located at a side of the first electrode away from the substrate; a hole transport layer, where the hole transport layer is located at a side of the hole injection layer away from the first electrode; a first light-emitting layer, where the first light-emitting layer comprises a plurality of light-emitting sublayers which comprises a green light-emitting sublayer, a red light-emitting sublayer and a yellow light-emitting sublayer; an interlayer, where the interlayer is located at a side of the first light-emitting layer away from the hole transport layer; a second light-emitting layer, where the second light-emitting layer is located at a side of the interlayer away from the first light-emitting layer, where a color of light emitted by the second light-emitting layer is different from a color of light emitted by the first light-emitting layer; a hole barrier layer, where the hole barrier layer is located at a side of the second light-emitting layer away from the interlayer; an electron transport layer, where the electron transport layer is located at a side of the hole barrier layer away from the second light-emitting layer; an electron injection layer, where the electron injection layer is located at a side of the electron transport layer away from the hole barrier layer; the second electrode, where the second electrode is located at a side of the electron injection layer away from the electron transport layer. Thus, the performance of the organic light-emitting display panel can be further improved.

According to embodiments of the present application, the organic light-emitting diode comprises: the first electrode; the hole injection layer, where the hole injection layer is located at a side of the first electrode away from the substrate; the hole transport layer, where the hole transport layer is located at a side of the first electrode away from the substrate; a first light-emitting layer, where the first light-emitting layer is located at a side of the hole transport layer away from the hole injection layer; an electron transport layer, where the electron transport layer is located at a side of the first light-emitting layer away from the hole transport layer; a charge generation layer, where the electron transport layer is located at a side of the electron transport layer away from the first light-emitting layer; a second hole injection layer, where the second hole injection layer is located at a side of the charge generation layer away from the electron transport layer; a second hole transport layer, where the second hole transport layer is located at a side of the second hole injection layer away from the charge generation layer; a plurality of second light-emitting layers, wherein the plurality of second light-emitting layers are stacked in sequence and located at a side of the second hole transport layer away from the second hole injection layer; a second electron transport layer, where the second electron transport layer is located at a side of the second light-emitting layer away from the second hole transport layer; an electron injection layer, where the electron injection layer is located at a side of the electron transport layer away from the second light-emitting layer; the second electrode, where the second electrode is located at a side of the electron injection layer away from the electron transport layer. Thus, the performance of the organic light-emitting display panel can be further improved.

According to embodiments of the present application, the organic light-emitting display panel further comprises the following elements between the substrate and the first electrode: a plurality of thin-film transistors, where the plurality of thin-film transistors is located at a side of the substrate, where each of the plurality of light-emitting diodes is connected to a source electrode of a corresponding thin-film transistor; a plurality of fan-out lines, where the plurality of fan-out lines is located at a side of the thin-film transistor away from the substrate, where a drain electrode of the thin-film transistor is connected to a corresponding fan-out line via a via hole. Thus, the performance of the organic light-emitting display panel can be further improved.

According to embodiments of the present application, the organic light-emitting display panel further comprises a pixel defining structure, where the pixel defining structure defines a plurality of sub-pixel regions on the substrate for containing the organic light-emitting diodes and the pixel defining structure exposes the first electrode located within each of the sub-pixel regions, and the anti-crosstalk isolating electrode is located at a side of the pixel defining structure away from the substrate. Thus, the anti-crosstalk electrode can be easily arranged on the pixel defining structure to save the area occupied by the anti-crosstalk isolating electrode.

According to embodiments of the present application, a protrusion is provided at a side of the pixel defining structure facing away from the substrate, and the anti-crosstalk isolating electrode is located at the protrusion. Thus, the performance of the organic light-emitting display panel can be further improved.

According to embodiments of the present application, the first electrode is located within the sub-pixel region, an edge of the pixel defining structure covers an edge of the first electrode, and forms a ramp conforming to the edge of the first electrode at a side of the pixel defining structure away from the substrate, and the protrusion is located between two adjacent ramps. Thus, the performance of the organic light-emitting display panel can be further improved.

According to embodiments of the present application, the anti-crosstalk isolating electrode and the first electrode are formed from the same material. Thus, the performance of the organic light-emitting display panel can be further improved.

According to embodiments of the present application, the anti-crosstalk isolating electrode is connected to the fan-out line via a via hole, and another terminal of the fan-out line connected to the anti-crosstalk isolating electrode is connected to a second electrode power supply line. Thus, the performance of the organic light-emitting display panel can be further improved.

According to embodiments of the present application, the voltage difference between the anti-crosstalk isolating electrode and the second electrode is greater than zero, and is not higher than a lighting voltage of the organic light-emitting diode. Thus, the performance of the organic light-emitting display panel can be further improved.

According to embodiments of the present application, the voltage difference between the anti-crosstalk isolating electrode and the second electrode is greater than zero, and is less than the voltage difference between the first electrode and the second electrode voltage. Thus, the performance of the organic light-emitting display panel can be further improved.

According to embodiments of the present application, the voltage difference between the anti-crosstalk isolating electrode and the second electrode is equal to 0. Thus, the performance of the organic light-emitting display panel can be further improved.

According to embodiments of the present application, the material from which the anti-crosstalk isolating electrode is formed is a metal material for preventing both an electrical crosstalk and an optical crosstalk.

According to embodiments of the present application, the anti-crosstalk isolating electrode satisfies at least one of: the anti-crosstalk isolating electrode being a ring structure surrounding a sub-pixel; the anti-crosstalk isolating electrode being electrically connected to a peripheral power supply terminal via a wiring in the substrate; a thicknesses of the anti-crosstalk isolating electrode being less than a thicknesses of the first electrode; and a width of the anti-crosstalk isolating electrode being less than half of a minimum distance between first electrodes of adjacent sub-pixels. Thus, the performance of the organic light-emitting display panel can be further improved.

According to embodiments of the present application, the anti-crosstalk isolating electrode and the first electrode are arranged in the same layer and spaced apart from each other.

According to embodiments of the present application, the anti-crosstalk isolating electrode and the first electrode are arranged in different layers and spaced apart from each other.

According to embodiments of the present application, the hole injection layer covers the anti-crosstalk isolating electrode and the first electrode, and the hole injection layer is in contact with both the anti-crosstalk isolating electrode and the first electrode.

In another aspect of the present application, a method of manufacturing the aforementioned display panel is provided. The method comprises: arranging a plurality of organic light-emitting diodes on a substrate, where the plurality of organic light-emitting diodes is located on the substrate, and each of the plurality of organic light-emitting diodes has a first electrode, a second electrode, a light-emitting layer and a hole injection layer, the light-emitting layer and the hole injection layer are located between the first electrode and the second electrode, and forming an anti-crosstalk isolating electrode at an interval between two adjacent the organic light-emitting diodes, to cause the anti-crosstalk isolating electrode to be connected to a fixed voltage. Thus, the aforementioned display panel can be obtained easily.

According to embodiments of the present application, the method comprises: evaporating a metal material in a material for forming a charge generation layer to dope metal therein when forming the plurality of organic light-emitting diodes, and applying voltage of the same polarities to the anti-crosstalk isolating electrode and the metal material to be evaporated when evaporating the metal material. Thus, the anti-crosstalk isolating electrode can be used to reduce a doping ratio of the metal at an interval between pixels, thereby reducing a lateral charge transport.

According to embodiments of the present application, the method further comprises an operation of forming a pixel defining structure on the substrate, an edge of the pixel defining structure covers an edge of the first electrode, and forms a ramp conforming to the edge of the first electrode at a side of the pixel defining structure away from the substrate, a surface of the pixel defining structure at a side of the pixel defining structure away from the substrate is provided with two adjacent ramps, a protrusion is provided between the two adjacent ramps, and the forming the anti-crosstalk isolating electrode comprises: depositing a metal at the protrusion to form the anti-crosstalk isolating electrode. Thus, the anti-crosstalk isolating electrode can be formed easily.

According to embodiments of the present application, the anti-crosstalk isolating electrode and the first electrode are formed by etching a material in the same layer. Thus, the anti-crosstalk isolating electrode can be obtained easily.

In another aspect of the present application, a display apparatus is provided. The display apparatus comprises the organic light-emitting display panel. Thus, the display apparatus possesses all of the features and advantages of the display panel described hereinbefore and the description of which is omitted hereby.

BRIEF DESCRIPTION OF THE DRAWINGS

The above and/or additional aspects and advantages of the present application will become apparent and comprehensible from the following description for the embodiments in conjunction with the accompanying drawings.

DETAILED DESCRIPTION

Figure 1:
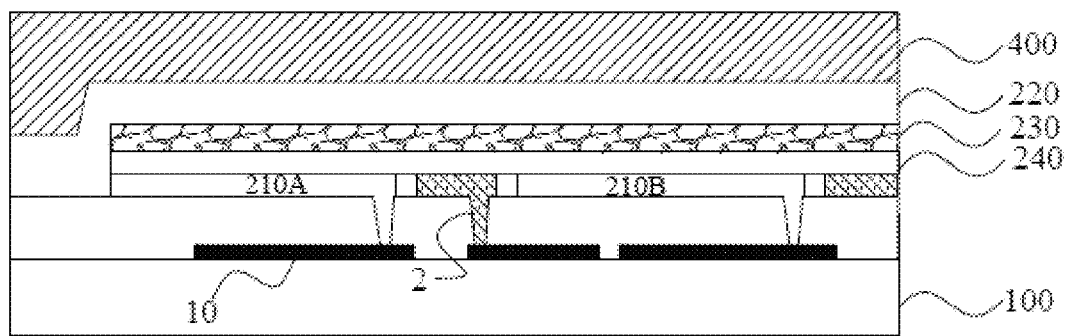
FIG. 1 shows a schematic view of a display panel according to an embodiment of the present application.

Embodiments of the present application will be illustrated in details hereinafter, examples for the embodiments are illustrated in the accompanying drawings, where throughout the drawings, like reference numerals refer to the same or similar elements, or elements having the same or similar functionality. The embodiments described below with reference to the figures are exemplary only for purposes of explaining the present application and are not to be construed as limitations to the present application.

In the description of the present application, the terms "upper", "lower", and the like indicate orientation or position relationships based on the orientation or position relationships shown in the figures and are merely for the convenience in describing the present application. The present application is not necessarily constructed and operated in such particular orientation, and therefore the present application is not limited thereto.

In one aspect of the present application, an organic light-emitting display panel is provided. Referring to FIG. 1, the organic light-emitting display panel comprises: a substrate 100 and a plurality of organic light-emitting diodes located on the substrate 100. The organic light-emitting diode has a first electrode (210A and 210B as shown in FIG. 1), a second electrode 220, a light-emitting layer 230 and a hole injection layer 240, the light-emitting layer 230 and the hole injection layer 240 are located between the first electrode and the second electrode 220. An anti-crosstalk isolating electrode 2 is provided at an interval between two adjacent organic light-emitting diodes. The anti-crosstalk isolating electrode 2 is connected to a fixed voltage and a voltage difference between the anti-crosstalk isolating electrode and the second electrode is less than a voltage difference between the first electrode and the second electrode. Thus, the anti-crosstalk isolating electrode 2 can be used to reduce the crosstalk problem caused by the hole injection layer and the like which have a higher mobility.

It should be specifically noted hereby that the first electrode and the second electrode are merely to distinguish two electrodes of the organic light-emitting diodes and they may be interchanged, which should not be construed as a limitation to the present application. Specifically, one of the first electrode and the second electrode is an anode, and the other is a cathode. In the present application, only an example in which the first electrode is the anode and the second electrode is the cathode is taken for describing the display panel in detail.

According to embodiments of the present application, the plurality of organic light-emitting diodes each may be a white organic light-emitting diode. In such a manner, the performance of the organic light-emitting display panel can be further improved. For convenience of understanding, the principle by which the display panel according to the embodiments of the present application can achieve the above-mentioned beneficial effects will be briefly explained as follows.

The current display panel based on a monochromatic organic light-emitting diode is difficult to be applied to a large-sized display panel (such as a television screen, etc.) because an evaporation process by using a Fine Metal Mask (FMM) is needed, so the white organic light-emitting diode is needed for display. For a white light-emitting device, in order to reduce a starting voltage of the device, a material having a better injection performance which also has a higher conductivity is needed to be introduced to form the hole injection layer (HIL) in addition to improve the injection power function of the first electrode. However, since the second electrode in the display panel is generally a common second electrode, a periphery (between two adjacent light-emitting units) of a pixel is often bright when being lit up. This will result in a crosstalk for real RGB pixel arrangement, and thus results in a reduced color gamut of the product. In the display panel according to the embodiments of the present application, the anti-crosstalk isolating electrode 2 provided at the interval between the organic light-emitting diodes is grounded, and thus the following issue can be addressed with the anti-crosstalk isolating electrode 2 at a low voltage: a light-emitting phenomenon at the interval caused by a carrier path formed in a region of the film layer(s) with a high electron mobility such as the hole injection layer and the like, which region is between two adjacent organic light-emitting diodes.

As mentioned above, the second electrode in the organic light-emitting diode is a common second electrode in general, and in the display panel, materials for the light-emitting layer, the hole injection layer and the like are deposited to form successive film layers. The light-emitting regions of two adjacent organic light-emitting diodes are actually distinguished by multiple first electrodes (210A and 210B as shown in the figure). Therefore, when the light-emitting diode has a film layer with a higher carrier mobility, an interval between two organic light-emitting diode may also emit light due to the carrier path formed inside this portion. It is specifically noted hereby that, in the present application, the phrase "interval between two organic light-emitting diodes" and the like should be interpreted in a broad sense unless specifically stated otherwise. In other words, the anti-crosstalk isolating electrode is located at the interval of two adjacent organic light-emitting diodes, which should be interpreted that an anti-crosstalk isolating electrode is provided at a position for an interval between light-emitting regions of two organic light-emitting diodes.

According to embodiments of the present application, the specific numerical value of the voltage applied to the anti-crosstalk isolating electrode is not particularly limited, as long as it is a fixed voltage and the voltage difference between the anti-crosstalk isolating electrode and the second electrode is less than the voltage difference between the first electrode and the second electrode. In this case, the voltage difference between the anti-crosstalk isolating electrode and the second electrode may be greater than 0, and may also be equal to 0. Specifically, in the case that the voltage difference between the anti-crosstalk isolating electrode and the second electrode is less than the voltage difference between the first electrode and the second electrode, the voltage difference between the anti-crosstalk isolating electrode and the second electrode may be greater than zero. As mentioned above, since materials for the light-emitting layer, the hole injection layer and the like are deposited to form successive film layers, making the voltage difference between the anti-crosstalk isolating electrode and the second electrode to be less than the voltage difference between the first electrode and the second electrode can prevent the light-emitting layer material at a position of the anti-crosstalk isolating electrode from being lit up unintendedly. More specifically, according to some embodiments of the present application, the voltage difference between the anti-crosstalk isolating electrode and the second electrode may be less than a lighting voltage of the organic light-emitting diode. Thus, the anti-crosstalk isolating electrode can prevent the crosstalk, as well as prevent the light-emitting layer material at the position between the anti-crosstalk isolating electrode and the second electrode from being lit up as the voltage difference between the anti-crosstalk isolating electrode and the second electrode being greater than the lighting voltage of the organic light-emitting diode.

Figure 3:
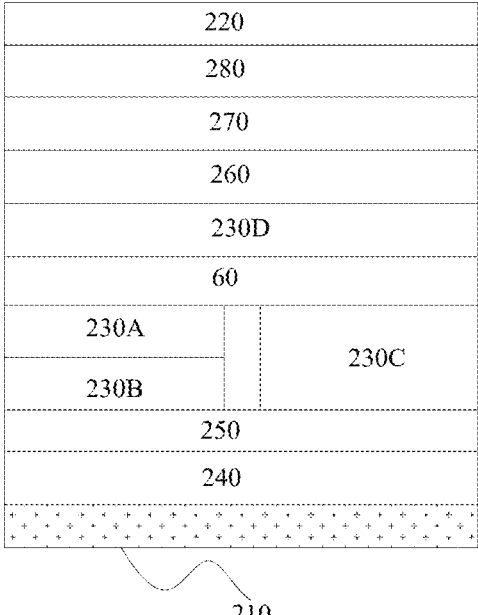
FIG. 3 shows a schematic view of an organic light-emitting diode according to an embodiment of the present application.

According to embodiments of the present application, the specific structure of the above-mentioned organic light-emitting diode is not particularly limited, as long as the film layers such as the hole injection layer and the like with higher carrier mobility are included. For example, referring to FIG. 3, according to a specific embodiment of the present application, the organic light-emitting diode may include the following elements stacked in the sequence listed: a first electrode 210, a hole injection layer 240, a hole transport layer 250, a first light-emitting layer including a plurality of light-emitting sublayers (230A to 230C as shown in the figure), an interlayer 60, a second light-emitting layer 230D, a hole barrier layer 260, an electron transport layer 270, an electron injection layer 280, and a second electrode 220. Thus, the plurality of light-emitting sublayers in the first light-emitting layer may specifically include a green light-emitting sublayer 230A, a red light-emitting sublayer 230B, and a yellow light-emitting sublayer 230C. The plurality of light-emitting sublayers in the first light-emitting layer each may be a fluorescent light-emitting layer. A color of light emitted by the second light-emitting layer is different from that emitted by said plurality of sublayers, and may, for example, be blue. Thus, the performance of the organic light-emitting display panel can be further improved.

Figures 4, 5:
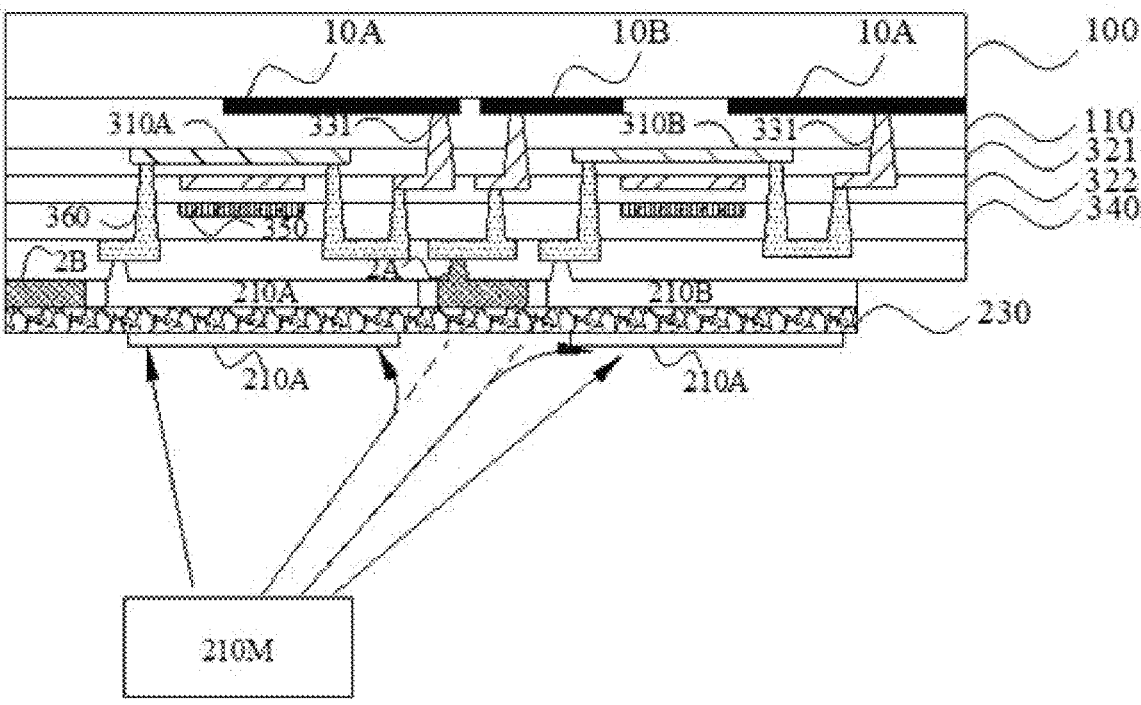
FIG. 4 shows a schematic view of an organic light-emitting diode according to another embodiment of the present application.
FIG. 5 shows a flow diagram of a portion of a method of manufacturing a display panel according to an embodiment of the present application.

According to embodiments of the present application, an organic light-emitting diode process in which all single devices are fluorescent is simple and of a low-cost, but as the demand for higher brightness of products in the market, it is required to develop a light-emitting device of a high brightness and a long service life. As a result, a white light device having two devices connected in series (2 Units Tandem) becomes an option. According to specific embodiments of the present application, the organic light-emitting diode may also have a structure as shown in FIG. 4. The organic light-emitting diode may specifically include the following element: a first electrode 210, a hole injection layer 240A, a hole transport layer 250A, a first light-emitting layer 230A, an electron transport layer 270A, a charge generation layer 70, a second hole injection layer 240B, a second hole transport layer 250B, a plurality of second light-emitting layers (230B and 230C as shown in the figure) sequentially stacked, a second electron transport layer 270B, an electron injection layer 280 and a second electrode 220. Thus, the performance of the organic light-emitting display panel can be further improved. In addition, the charge generation layer of the organic light-emitting diode in the embodiments is generally formed from an organic material doped with the metal, and thus is also easily turned on at a position between two adjacent first electrodes when the panel is lit up. Thus, the above anti-crosstalk isolating electrode can also prevent the crosstalk caused by the carrier linked at the charge generation layer.

Figure 2:
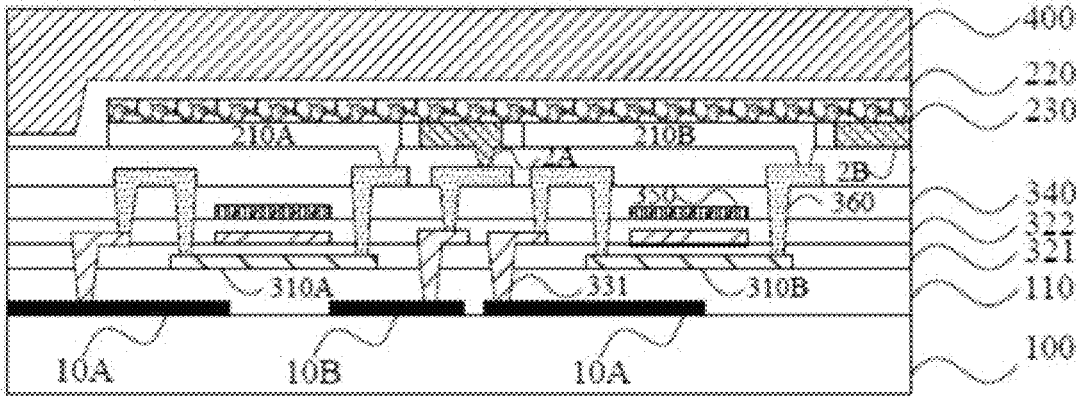
FIG. 2 shows a schematic view of a display panel according to another embodiment of the present application.

According to embodiments of the present application, the display panel may also have a structure that a general organic light-emitting display panel may have, such as a back plate circuit element, an encapsulation structure, etc. Specifically, referring to FIG. 2, the display panel may further include a plurality of fan-out lines (10A and 10B as shown in the figure) between the substrate 100 and the first electrode 210. A buffer layer 110 may separate the fan-out lines from an active layer (310A and 310B as shown in the figure) of a thin-film transistor in the back plate circuit for controlling the organic light-emitting diode to realize an insulation therebetween. The thin-film transistor may have the active layer (310A and 310B as shown in the figure), a first gate insulating layer 321 and a second gate insulating layer 322. A gate metal layer 331 may be located between the first gate insulating layer 321 and the second gate insulating layer 322 to form structures such as a gate electrode (directly opposite to the active layer) and a gate metal line. The gate metal line may be connected to the fan-out line 10A by a via hole penetrating the buffer layer 110, so as to be connected with a structure such as a gate driving circuit or the like, thereby controlling the turning on and off of the thin-film transistor. An interlayer insulating layer 340 may be provided at a side of the second gate insulating layer 322 away from the substrate 100, and a second gate metal 350 may also be provided on the second gate insulating layer 322. The second gate metal 350 may form a second gate electrode, or be used to form a capacitor or the like. A source-drain electrode layer 360 may be provided at a side of the interlayer insulating layer 340 away from the substrate 100, and the source-drain electrode layer may form a source electrode and a drain electrode of the thin-film transistor, and a source electrode line (data line). The first electrode of the light-emitting diode may be connected to the source electrode of the thin-film transistor, and the drain electrode of the thin-film transistor may be connected to the fan-out line by a via hole. Thus, the light-emitting diode can be controlled to emit light by using the thin-film transistor. The display panel may also have a structure such as an encapsulation layer 400 for preventing the light-emitting layer 230 from being corroded by the water and oxygen in the environment.

According to other embodiments of the present application, the fan-out line may also be located at a side of the thin-film transistor away from the substrate. That is, the fan-out line may also be located above the thin-film transistor (not shown in the figure). Specifically, a plurality of thin-film transistors is located at a side of the substrate, each light-emitting diode is connected to a source electrode of one thin-film transistor, and a fan-out line is connected to a drain electrode of the one thin-film transistor by a via hole. In this manner, a vertical distance (in a direction perpendicular to a plane where the substrate is located) between the fan-out line and the anti-crosstalk isolating electrode can be further shortened.

According to embodiments of the present application, the specific manner of implementing the connection between the anti-crosstalk isolating electrode and the fixed voltage is not particularly limited. For example, specifically, the anti-crosstalk isolating electrode may be connected to the second electrode power supply line (VSS) by the fan-out line 10B. Thus, the anti-crosstalk isolating electrode can be ensured to have a low voltage, thereby realizing the function of preventing the crosstalk.

According to embodiments of the present application, the aforementioned specific arranging position and manner for the anti-crosstalk isolating electrode are not particularly limited, as long as the aforementioned anti-crosstalk and isolation effect can be achieved. For example, referring to FIG. 6, according to some embodiments of the present application, the panel may further include a pixel defining structure 380. The pixel defining structure 380 defines a plurality of sub-pixel regions on the substrate 100 for housing organic light-emitting diodes, and exposes the first electrode (210A and 210B as shown in the figure) located within each of the sub-pixel regions. The anti-crosstalk isolating electrode (2A and 2B as shown in the figure) may be located on a surface of the pixel defining structure at a side of the pixel defining structure away from the substrate. Thus, the aforementioned anti-crosstalk isolating electrode can be formed with the surface of the pixel defining structure at the side of the pixel defining structure facing away from the substrate, so that the anti-crosstalk isolating electrode can be prevented from occupying additional space of the substrate, which is advantageous for improving the aperture ratio of the panel. As described above, the anti-crosstalk isolating electrode proposed in the present application is for supplying the fixed voltage to prevent the region(s) among the light-emitting diodes from being lit up unintendedly, and thus the anti-crosstalk isolating electrode and the first electrode need to be disconnected. By arranging the anti-crosstalk isolating electrode on the surface of the pixel defining structure at the side of the pixel defining structure away from the substrate, the anti-crosstalk isolating electrode can be disconnected from the first electrode by using the pixel defining structure which has a certain height itself, and thus the process of manufacturing the anti-crosstalk isolating electrode can be simplified.

Figure 7:
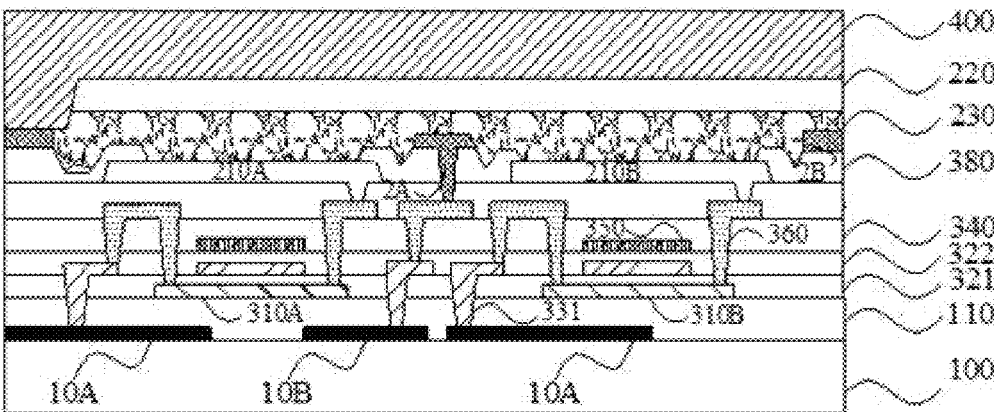
FIG. 7 shows a schematic view of a display panel according to another embodiment of the present application.

According to other specific embodiments of the present application, referring to FIG. 7, the first electrode is located within the sub-pixel region, an edge of the pixel defining structure covers an edge of the first electrode, and a ramp conforming to the edge of the first electrode is formed at a side of the pixel defining structure 380 away from the substrate 100. That is, a protrusion may be provided at a side of the pixel defining structure facing away from the substrate, and the anti-crosstalk isolating electrode may be located at the protrusion. The protrusion is located between two adjacent ramps.

It should be specifically noted hereby that in the application, the term "conforming to" should be interpreted in a broad sense and should not be interpreted as the two item have an identical shape. In other words, the edge of the pixel defining structure 380 at the side of the pixel defining structure 380 away from the substrate 100 has a shape substantially identical to the edge of the first electrode, that is, the inclination directions for the ramps are identical, rather than the angles for the ramps are identical. It will be understood by those skilled in the art that the edge of the pixel defining structure 380 at the side of the pixel defining structure 380 away from the substrate 100 is formed based on the ramp edge of the first electrode when forming the pixel defining structure, so that the edge of the pixel defining structure and the edge of the first electrode both have the same inclination direction and similar slope angle.

According to embodiments of the present application, the anti-crosstalk isolating electrode and the first electrode may be formed from the same material. Thus, on the one hand, the anti-crosstalk isolating electrode can be closer to the film layer with a larger carrier mobility such as the hole injection layer, and on the other hand, it is convenient to connect the anti-crosstalk isolating electrode to the fan-out line 10B by the via hole.

According to embodiments of the present application, the material for forming the anti-crosstalk isolating electrode is not particularly limited, and may be, for example, a metal material with which both an electrical crosstalk and an optical crosstalk can be prevented. Thus, the performance of the display panel can be further improved.

According to embodiments of the present application, the anti-crosstalk isolating electrode may also satisfy at least one of the following conditions: the anti-crosstalk isolating electrode is a ring structure surrounding a sub-pixel; the anti-crosstalk isolating electrode is electrically connected to a peripheral power supply terminal via a wiring in the substrate; a thicknesses of the anti-crosstalk isolating electrode is less than a thicknesses of the first electrode; and a width of the anti-crosstalk isolating electrode is less than half of a minimum distance between first electrodes of adjacent sub-pixels. With the ring structure surrounding the sub-pixel, adjacent sub-pixels can be spaced apart better. With the anti-crosstalk isolating electrode being electrically connected to the power supply terminal, a stable fixed voltage can be provided. With the thicknesses of the anti-crosstalk isolating electrode being less than that of the first electrode, or the width being less than half of the minimum distance between the first electrodes of adjacent sub-pixels, an issue such as a short-circuit caused by the anti-crosstalk isolating electrode having an excessive volume can be addressed.

In another aspect of the present application, a method of manufacturing the aforementioned display panel is provided. The method may include a step of arranging a plurality of organic light-emitting diodes on a substrate. The organic light-emitting diode has a first electrode, a second electrode, a light-emitting layer and a hole injection layer, the light-emitting layer and the hole injection layer is located between the first electrode and the second electrode. An anti-crosstalk isolating electrode may be formed at an interval between two adjacent organic light-emitting diodes, to cause the anti-crosstalk isolating electrode to be connected to the ground. Thus, the aforementioned display panel can be obtained easily.

With regard to the specific structure of the organic light-emitting diode, a detailed description has been made above and is omitted here. A suitable process can be selected to form the aforementioned organic light-emitting diode by those skilled in the art according to the specific structure.

According to embodiments of the present application, the organic light-emitting diode may have the structure as shown in FIG. 4. In these embodiments, a density of doping metal in the charge generation layer may also be reduced by using the anti-crosstalk isolating electrode. For the display panel product with a relatively low PPI, this can be achieved by reducing the electrical performance of the charge generation layer (CGL) or by increasing the distance between pixels. Due to a limitation of pixel distance in a display panel including silicon-based thin-film transistors which has a high brightness, an operating voltage and a power consumption of the panel will be increased if the electrical performance of charge generation layer is degraded, which also result in a difficulty in the cross-voltage design for CMOS. Referring to FIG. 5, when forming the organic light-emitting diode, a metal material is evaporated into the material for forming the charge generation layer (210A as shown in the figure) to dope metal. When evaporating the metal material, voltages having the same polarities may be applied to the anti-crosstalk isolating electrode and the metal material to be evaporated (such as 210M in the figure). In this way, the anti-crosstalk isolating electrode can be used to create a force that repels the electric field for the evaporation, thereby reducing a doping ratio of the metal at an interval between pixels (referring to dashed lines in FIG. 5) and thus a lateral transport of the charge can be reduced. In addition, since the anti-crosstalk isolating electrode is located only at the interval between pixels, the density of the doping metal in the charge generation layer of the light-emitting region is not influenced by this method, so that the performance of the organic light-emitting diode can be ensured.

According to embodiments of the present application, the anti-crosstalk isolating electrode and the first electrode are formed by etching the same layer of material. Thus, the anti-crosstalk isolating electrode can be obtained easily.

Figure 6:
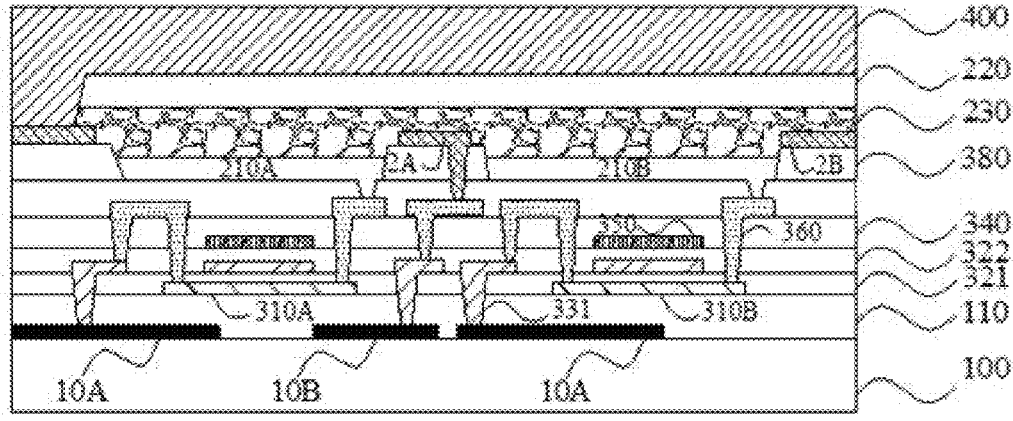
FIG. 6 shows a schematic view of a display panel according to an embodiment of the present application.

According to other embodiments of the present application, the anti-crosstalk isolating electrode and the first electrode may also not be formed from the same material. For example, as shown in FIGS. 6 and 7, the anti-crosstalk isolating electrode may also be located on a surface of the pixel defining structure at a side of the pixel defining structure away from the substrate. In this case, an operation of forming the anti-crosstalk isolating electrode may be performed after the pixel defining structure and the first electrode are formed.

In another aspect of the present application, a display apparatus is provided. The display apparatus comprises the organic light-emitting display panel. Thus, the display apparatus has all of the features and advantages of the previously described display panel and the description of which is omitted herein.

In the description of the present specification, a description with reference to the terms "an embodiment", "another embodiment" and the like refers to that a particular feature, structure, material, or characteristic described in connection with the embodiment is included in at least an embodiment of the present application. In this specification, schematic representations for the above terms are not necessarily directed to the same embodiment or example. Further, the particular features, structures, materials, or characteristics described may be combined in any suitable manner in any one or more of embodiments or examples. Furthermore, different embodiments or examples and features of different embodiments or examples described in this specification can be combined and grouped by a person skilled in the art in a case that there is no contradiction. In addition, it is noted that in this specification, the terms "first" and "second" are used for illustrative purposes only and are not to be interpreted as indicating or implying relative importance or as implicitly indicating the number of technical features.

While the embodiments of the present application have been illustrated and described above, it is to be understood that the embodiments are exemplary and not to be construed as limitations to the present application, and changes, modifications, substitutions, and variations may be made to the embodiments may be made by one of ordinary skill in the art without departing from the scope of the present application.

What is claimed is:

1. An organic light-emitting display panel, comprising:
   a substrate;
   a plurality of organic light-emitting diodes, wherein the plurality of organic light-emitting diodes is located on the substrate, and each of the plurality of organic light-emitting diodes has a first electrode, a second electrode, a light-emitting layer and a hole injection layer, the light-emitting layer and the hole injection layer are located between the first electrode and the second electrode;
   an anti-crosstalk isolating electrode, wherein the anti-crosstalk isolating electrode is located at an interval between two adjacent organic light-emitting diodes, the anti-crosstalk isolating electrode is configured to be connected to a fixed voltage, and a voltage difference between the anti-crosstalk isolating electrode and the second electrode is less than a voltage difference between the first electrode and the second electrode;
   wherein the light-emitting layer covers the anti-crosstalk isolating electrode and the first electrode to space apart the anti-crosstalk isolating electrode and the second electrode;
   wherein the anti-crosstalk isolating electrode is a ring structure surrounding a sub-pixel; and
   wherein the voltage difference between the anti-crosstalk isolating electrode and the second electrode is greater than zero.

2. The organic light-emitting display panel according to claim 1, wherein each of the plurality of organic light-emitting diodes is a white organic light-emitting diode.

3. The organic light-emitting display panel according to claim 2, wherein each of the plurality of organic light-emitting diodes comprises:
   the first electrode;
   the hole injection layer, the hole injection layer being located at a side of the first electrode away from the substrate;
   a hole transport layer, the hole transport layer being located at a side of the hole injection layer away from the first electrode;

a first light-emitting layer, the first light-emitting layer comprising a plurality of light-emitting sublayers, the plurality of light-emitting sublayers comprising a green light-emitting sublayer, a red light-emitting sublayer and a yellow light-emitting sublayer;

an interlayer, the interlayer being located at a side of the first light-emitting layer away from the hole transport layer;

a second light-emitting layer, the second light-emitting layer being located at a side of the interlayer away from the first light-emitting layer, and a color of light emitted by the second light-emitting layer is different from a color of light emitted by the first light-emitting layer;

a hole barrier layer, the hole barrier layer being located at a side of the second light- emitting layer away from the interlayer;

an electron transport layer, the electron transport layer being located at a side of the hole barrier layer away from the second light-emitting layer;

an electron injection layer, the electron injection layer being located at a side of the electron transport layer away from the hole barrier layer; and the second electrode, the second electrode being located at a side of the electron injection layer away from the electron transport layer.

4. The organic light-emitting display panel according to claim 2, wherein each of the plurality of organic light-emitting diodes comprises:

the first electrode;

the hole injection layer, the hole injection layer being located at a side of the first electrode away from the substrate;

a hole transport layer, the hole transport layer being located at the side of the first electrode away from the substrate;

a first light-emitting layer, the first light-emitting layer being located at a side of the hole transport layer away from the hole injection layer;

an electron transport layer, the electron transport layer being located at a side of the first light-emitting layer away from the hole transport layer;

a charge generation layer, the charge generation layer being located at a side of the electron transport layer away from the first light-emitting layer;

a second hole injection layer, the second hole injection layer being located at a side of the charge generation layer away from the electron transport layer;

a second hole transport layer, the second hole transport layer being located at a side of the second hole injection layer away from the charge generation layer;

a plurality of second light-emitting layers, the plurality of second light-emitting layers being stacked on one another, and being located at a side of the second hole transport layer away from the second hole injection layer;

a second electron transport layer, the second electron transport layer being located at a side of the plurality of second light-emitting layers away from the second hole transport layer;

an electron injection layer, the electron injection layer being located at a side of the electron transport layer away from the plurality of second light-emitting layers; and the second electrode, the second electrode being located at a side of the electron injection layer away from the electron transport layer.

5. The organic light-emitting display panel according to claim 1, further comprising the following elements between the substrate and the first electrode:

a plurality of thin-film transistors, the plurality of thin-film transistors being located at a side of the substrate, and each of the plurality of organic light-emitting diodes being connected to a source electrode of one of the plurality of thin-film transistors, and a plurality of fan-out lines, the plurality of fan-out lines being located at a side of the plurality of thin-film transistors away from the substrate, and a drain electrode of one of the plurality of thin-film transistors is connected to a corresponding one of the plurality of fan-out lines via a via hole.

6. The organic light-emitting display panel according to claim 5, further comprising a pixel defining structure, wherein the pixel defining structure defines a plurality of sub-pixel regions on the substrate for containing the plurality of organic light-emitting diodes, and the pixel defining structure exposes the first electrode located within each of the plurality of sub-pixel regions, and the anti-crosstalk isolating electrode is located at a side of the pixel defining structure away from the substrate.

7. The organic light-emitting display panel according to claim 6, wherein the pixel defining structure has a protrusion at a side of the pixel defining structure facing away from the substrate, the anti-crosstalk isolating electrode is located at the protrusion.

8. The organic light-emitting display panel according to claim 7, wherein the first electrode is located within each of the plurality of sub-pixel regions, an edge of the pixel defining structure covers an edge of the first electrode and forms a ramp conforming to the edge of the first electrode at a side of the pixel defining structure away from the substrate, and the protrusion is located between two adjacent ramps.

9. The organic light-emitting display panel according to claim 5, wherein the anti-crosstalk isolating electrode and the first electrode are formed from the same material.

10. The organic light-emitting display panel according to claim 6, wherein the anti-crosstalk isolating electrode is connected to the fan-out line via a via hole, and another terminal of the fan-out line connected to the anti-crosstalk isolating electrode is connected to a second electrode power supply line.

11. The organic light-emitting display panel according to claim 1, wherein the voltage difference between the anti-crosstalk isolating electrode and the second electrode is not higher than a lighting voltage for the plurality of organic light-emitting diodes.

12. The organic light-emitting display panel according to claim 1, wherein the material for forming the anti-crosstalk isolating electrode is a metal material for preventing both an electrical crosstalk and an optical crosstalk.

13. The organic light-emitting display panel according to claim 1, wherein the anti-crosstalk isolating electrode satisfies at least one of:

the anti-crosstalk isolating electrode being electrically connected to a peripheral power supply terminal via a wiring in the substrate;

a thicknesses of the anti-crosstalk isolating electrode being less than a thicknesses of the first electrode; or a width of the anti-crosstalk isolating electrode being less than half of a minimum distance between first electrodes of adjacent sub-pixels.

14. The organic light-emitting display panel according to claim 1, wherein the anti-crosstalk isolating electrode and the first electrode are arranged in the same layer and spaced apart from each other; or the anti-crosstalk isolating electrode and the first electrode are arranged in different layers and spaced apart from each other.

15. The organic light-emitting display panel according to claim 14, wherein in a case that the anti-crosstalk isolating electrode and the first electrode are arranged in the same layer and spaced apart from each other, the hole injection layer covers the anti-crosstalk isolating electrode and the first electrode, and the hole injection layer is in contact with both the anti-crosstalk isolating electrode and the first electrode.

16. The organic light-emitting display panel according to claim 1, wherein the hole injection layer covers the anti-crosstalk isolating electrode and the first electrode, and the hole injection layer is in contact with both the anti-crosstalk isolating electrode and the first electrode.

17. A display apparatus, comprising an organic light-emitting display panel, wherein the organic light-emitting display panel comprises:

a substrate;

a plurality of organic light-emitting diodes, wherein the plurality of organic light-emitting diodes is located on the substrate, and each of the plurality of organic light-emitting diodes has a first electrode, a second electrode, a light-emitting layer and a hole injection layer, the light-emitting layer and the hole injection layer are located between the first electrode and the second electrode;

an anti-crosstalk isolating electrode, wherein the anti-crosstalk isolating electrode is located at an interval between two adjacent organic light-emitting diodes, the anti-crosstalk isolating electrode is configured to be connected to a fixed voltage, and a voltage difference between the anti-crosstalk isolating electrode and the second electrode is less than a voltage difference between the first electrode and the second electrode;

wherein the light-emitting layer covers the anti-crosstalk isolating electrode and the first electrode to space apart the anti-crosstalk isolating electrode and the second electrode;

wherein the anti-crosstalk isolating electrode is a ring structure surrounding a sub-pixel; and wherein the voltage difference between the anti-crosstalk isolating electrode and the second electrode is greater than zero.

* * * * *